US008572521B2

(12) United States Patent
Chen et al.

(10) Patent No.: US 8,572,521 B2
(45) Date of Patent: Oct. 29, 2013

(54) METHOD FOR PERFORMING PATTERN DECOMPOSITION FOR A FULL CHIP DESIGN

(75) Inventors: Luoqui Chen, Saratoga, CA (US); Hong Chen, San Jose, CA (US); Jiangwei Li, Palo Alto, CA (US); Robert John Socha, Campbell, CA (US)

(73) Assignee: ASML Netherlands B.V., Veldhoven (NL)

( * ) Notice: Subject to any disclaimer, the term of this patent is extended or adjusted under 35 U.S.C. 154(b) by 341 days.

(21) Appl. No.: 12/270,498

(22) Filed: Nov. 13, 2008

(65) Prior Publication Data

US 2009/0125866 A1      May 14, 2009

Related U.S. Application Data

(60) Provisional application No. 60/996,348, filed on Nov. 13, 2007.

(51) Int. Cl.
*G06F 17/50* (2006.01)

(52) U.S. Cl.
USPC .................. 716/54; 716/52; 716/56

(58) Field of Classification Search
USPC .................. 716/19, 124, 52, 54, 56
See application file for complete search history.

(56) References Cited

U.S. PATENT DOCUMENTS

| | | |
|---|---|---|
| 5,969,441 A | 10/1999 | Loopstra et al. |
| 6,046,792 A | 4/2000 | Van Der Werf et al. |
| 2002/0152454 A1 * | 10/2002 | Cote et al. .................. 716/21 |
| 2008/0166639 A1 * | 7/2008 | Park et al. .................. 430/5 |
| 2008/0184191 A1 | 7/2008 | Socha |
| 2008/0307381 A1 * | 12/2008 | Tritchkov et al. .................. 716/11 |

OTHER PUBLICATIONS

Law, C.C. et al., "A multi-threaded streaming pipeline architecture for large structured data sets", Oct. 29, 1999, Visualization '99. Proceedings, pp. 225-232.*

* cited by examiner

*Primary Examiner* — Stacy Whitmore
*Assistant Examiner* — Bryce Aisaka
(74) *Attorney, Agent, or Firm* — Pillsbury Winthrop Shaw Pittman LLP

(57) ABSTRACT

A method for decomposing a target pattern containing features to be printed on a wafer into multiple patterns. The method includes the steps of segmenting the target pattern into a plurality of patches; identifying critical features within each patch which violate minimum spacing requirements; generating a critical group graph for each of the plurality of patches having critical features, where the critical group graph of a given patch defines a coloring scheme of the critical features within the given patch, and the critical group graph identifies critical features extending into adjacent patches to the given patch; generating a global critical group graph for the target pattern, where the global critical group graph includes the critical group graphs of each of the plurality of patches, and an identification of the features extending into adjacent patches; and coloring the target pattern based on the coloring scheme defined by the global critical group graph.

20 Claims, 12 Drawing Sheets

B is fractured by the conflicting area of A

Critical group graph

FIG.11a Input graph
FIG.11b Min-span-forest
FIG.11c Output graph

METHOD FOR PERFORMING PATTERN DECOMPOSITION FOR A FULL CHIP DESIGN

CROSS-REFERENCE TO RELATED APPLICATIONS

The present application claims priority to U.S. Provisional Application No. 60/996,348 filed on Nov. 13, 2007.

TECHNICAL FIELD

The technical field of the present invention relates generally to a method, program product and apparatus for performing a decomposition of a target pattern into multiple patterns so as to allow the target pattern to be imaged utilizing, for example, multiple masks in a multiple illumination process, and more specifically to a method for performing pattern decomposition for a full chip design.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). As the critical dimensions of the target patterns become increasingly smaller, it is becoming increasingly harder to reproduce the target patterns on the wafer. However, there are known techniques that allow for a reduction in the minimum CD that can be imaged or reproduced in a wafer. One such technique is the double exposure technique wherein features in the target pattern are imaged in two separate exposures.

For example, one commonly known double exposure technique is referred to as double-patterning or DPT. This technique allows the features of a given target pattern to be separated into two different masks and then imaged separately to form the desired pattern. Such a technique is typically utilized when the target features are spaced so closely together that it is not possible to image the individual features. In such a situation, the target features are separated into two masks such that all the features on a given mask are spaced sufficiently apart from one another so that each feature may be individually imaged. Then, by imaging both masks in a sequential manner (with the appropriate shielding), it is possible to obtain the target pattern having the densely spaced features that could not be properly imaged utilizing a single mask.

Thus, by separating the target features into two separate masks, such that the pitch between each of the features on a given mask is above the resolution capabilities of the imaging system, it is possible to improve imaging performance. Indeed, the above-mentioned double exposure techniques allow for a $k_1$<0.25. However, problems and limitations still exist with currently known double exposure techniques.

For example, the existing rule-based and model-based algorithms do not allow for ready or efficient processing of large full chip designs. In other words, many of the current methods lack scalability. In addition, typical current pattern splitting algorithms utilize a rectangle or single polygon as the basic fracturing/separation element. The use of such a single polygon as the basis for separating the pattern often requires too many resources for a global solution for a full-chip design, and is therefore not practical.

Accordingly, there is a need for pattern decomposition method which can readily accommodate a full-chip design, and which solves the foregoing problems of the prior art pattern decomposition methods.

SUMMARY OF THE INVENTION

In view of the foregoing, it is an object of the present invention to overcome the deficiencies of known prior art techniques by providing a decomposition process which exhibits good scalability and which can readily accommodate a full-chip design. As explained in further detail below, the method entails segmenting the original design into a set of patches and then processing the patches (i.e., decomposition of the features within a given patch) in a parallel manner. In addition, at the boundaries of the patches, the split/decomposition results of adjacent patches are considered and adjustment may be made such that the boundaries of the individual patches are consistent with one another (i.e., avoid coloring conflicts at boundaries of the adjacent patches).

In summary, the present invention provides a method for decomposing a target pattern containing features to be printed on a wafer into multiple patterns. The method includes the steps of segmenting the target pattern into a plurality of patches; identifying critical features within each patch which violate minimum spacing requirements; generating a critical group graph for each of the plurality of patches having critical features, where the critical group graph of a given patch defines a coloring scheme of the critical features within the given patch, and the critical group graph identifies critical features extending into adjacent patches to the given patch; generating a global critical group graph for the target pattern, where the global critical group graph includes the critical group graphs of each of the plurality of patches, and an identification of the features extending into adjacent patches; and coloring the target pattern based on the coloring scheme defined by the global critical group graph.

As explained below in further detail, the process of the present invention provides numerous advantages over the known decomposition processes. Most importantly, the process provides for a fast and efficient method of decomposing a full-chip pattern or design. In particular, the process of the present invention allows processing (i.e., decomposition) of patches of the design to be executed in parallel thereby reducing the time required for completion of the decomposition process. The process also provides, through the use of the "Critical Group Graph", a flexible framework which allows for easy incorporation of previous patch level decompositions or coloring. Further, the process also provides for, through the use of "Critical Groups", a reduction in the amount of data that is required to be processed at the full-chip level, thereby significantly reducing the data processing capability requirements and the time required to complete the decomposition process. Finally, the hierarchical structure of the "Global Graph Coloring Solver" of the present invention provides good scalability for handling large full-chip designs.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE INVENTION

As explained in further detail below, the decomposition process of the present invention provides a method for performing a full-chip decomposition in a time and computational efficient manner. General speaking, the process divides the full chip design into a plurality of individual patches, and then decomposes/colors/splits each patch individually. Preferably, the processing of the patches is performed in a parallel manner. Thereafter, the process proceeds to confirm the boundaries of the individual patches are consistent with one another (i.e., avoid coloring conflicts at boundaries of the adjacent patches), and makes adjustments where necessary. By performing the pattern decomposition in the foregoing manner, the present invention provides for increased scalability and ready application to a full-chip design.

Figure 1:
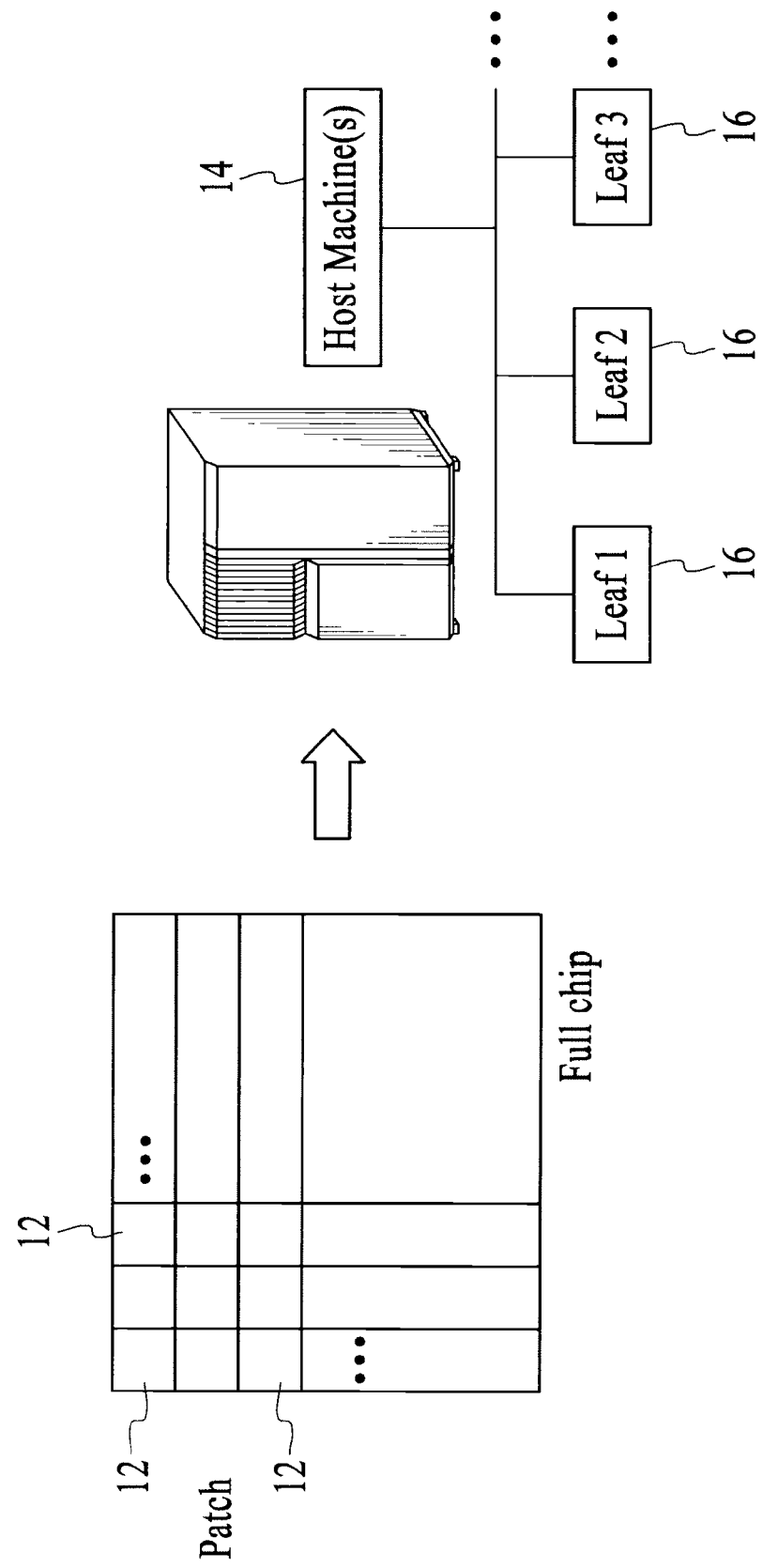
FIG. 1 is an exemplary diagrammatic illustration of the patch-based parallel processing decomposition process of the present invention.

FIG. 1 is an exemplary diagrammatic illustration of the patch-based parallel processing decomposition process of the present invention. Referring to FIG. 1, in accordance with the process, a full-chip design is segmented into a plurality of patches 12. In the preferred embodiment, the patches 12 are of equal size and shape, and contain the portion of the full chip design that corresponds to the location of the given patch 12. However, it is also possible to separate the full-chip design into patches of different sizes and shapes. FIG. 1 also illustrates the parallel processing aspect of the present invention. A host machine/computer 14, overseeing the decomposition process, distributes the design data associated with each individual patch 12 to a separate processor 16 (referred to a leaf machine), so that each leaf machine 16 can process/decompose the features within the given patch 12 assigned to the given leaf machine in a parallel manner with the other leaf machines 16.

Figure 2A:
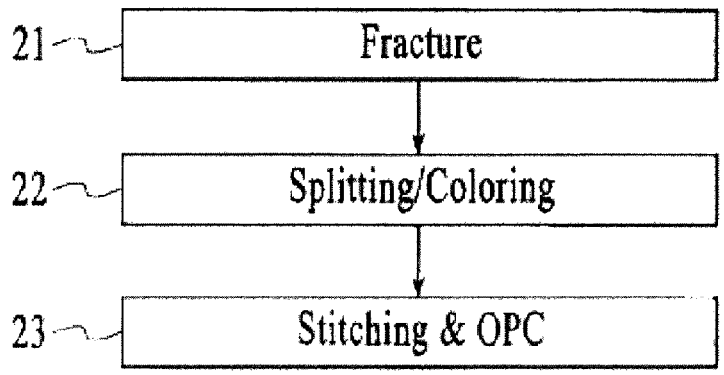
FIG. 2a illustrates a high level flowchart of a general pattern splitting/coloring algorithm.

FIG. 2a illustrates a high level flowchart of a general prior art pattern splitting/coloring algorithm. As shown, the first step 21 entails fracturing the pattern into a plurality of segments, and then the next step 22 entails splitting or coloring the features contained in each of the segments into multiple patterns. As is known, and explained above in the background section, features (also referred to as polygons herein) cannot be printed in the same mask if the features are positioned too close to one another (i.e., below the resolution limit of the given process being utilized). This hard limitation is referred to as the "Critical Relationship" between features. The final step 23 in the process is to combine (i.e., stitch) together the numerous segments after which optical proximity correction (OPC) techniques are typically applied to the design.

Thus, in order image features properly, no two features can be positioned in a single mask if the features have a Critical Relationship, which typically defines the minimum spacing between two features for the given lithography process being utilized. It is noted that maintaining and satisfying the Critical Relationship is a major issue associated with full-chip decomposition, as the Critical Relationship can span across multiple patches (e.g., there may be a set of features in several patches, and the features are linked by a set of Critical Relationships). Moreover, attempting to solve inconsistencies or violations in the Critical Relationship at the local level often proves to be quite difficult.

Figure 2B:
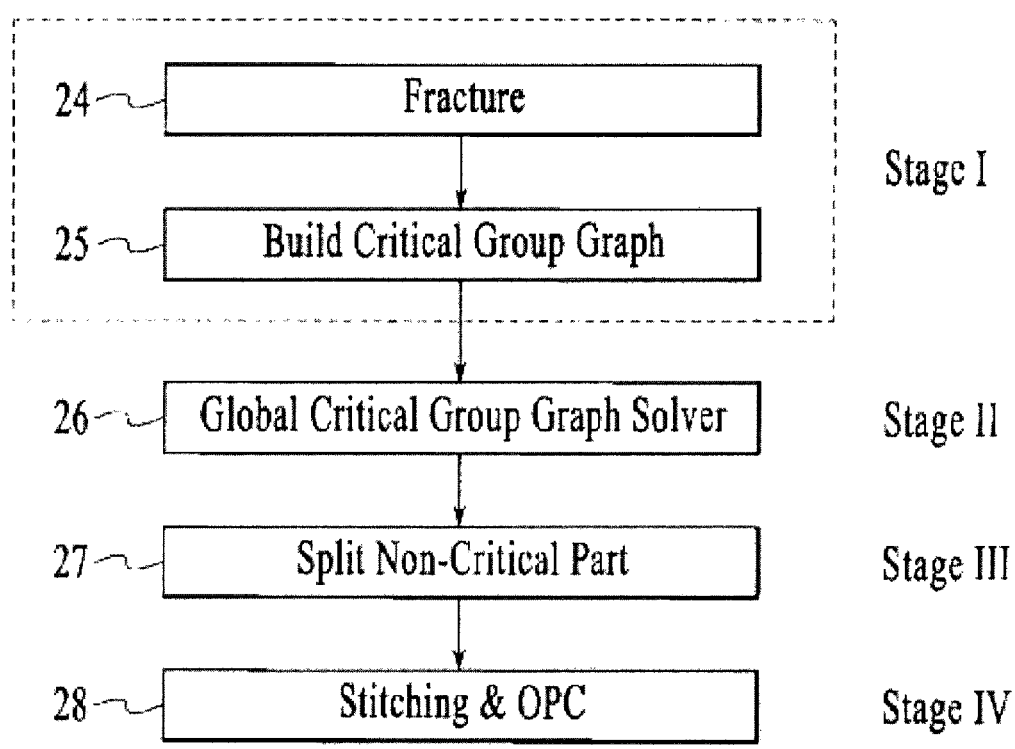
FIG. 2b is a high level flowchart of the process of the present invention.

FIG. 2b is a high level flowchart of the process of the present invention. As shown, the process is essential divided into four stages I, II, III and IV. Stage I includes the initial fracturing step 24 and a step 25 of building a "Critical Group Graph". In Stage I, the target design is fractured into a set of basic patches 12, each of which includes polygons or features to be imaged. As explained below, a Critical Group is defined so as to label the features or polygons which are connected by the Critical Relationship (i.e., identify those features which are too close together and therefore violate the Critical Relationship). In other words, polygons which have a critical relationship with respect to one another are grouped into a single critical group. It is noted that the features contained in the Critical Group have a default splitting/decomposition process for the features/polygons of the given patch. There are only two possible statuses: maintaining the default splitting/coloring process or flipping or reversing the default splitting/coloring process. Thereafter, a Critical Group Graph is constructed which is utilized to encode the correlation between different Critical Groups.

It is noted that there are two basic types of relationships (i.e., constraints) utilized to construct the Critical Group Graph. The first is that if two critical polygons are linked by non-critical polygons, it is preferable to maintain the two polygons in same layer. The second is that at the patch boundary, the same polygon should be assigned to the same color in different patches, which is reflected at the global level (i.e., the Global Critical Group Graph).

Stage II includes the step 26 of performing the process of the Global Critical Group Graph Solver. As explained in detail below, the Global Critical Group Graph Solver is utilized to assign the status for each Critical Group while attempting to maintain the important correlations. For example, as noted above, if two critical polygons are linked by a non-critical polygons, it's preferable to maintain them in them same layer. Or in other words, there is a "cost" associated with separating the polygons into two masks (layers). This cost can be calculated by a suitable printability analysis. In the embodiment disclosed herein, the cost is approximated utilizing the distance between the critical polygons. Secondly, at the patch boundary, the same polygon must be assigned the same color in different patches. These types of constraints are hard constraints.

During Stage II, the features/polygons inside each Critical Group are determined (i.e., split or colored) by the status and their default splitting configurations. It is noted that in the preferred embodiment, Stage II is executed globally in the host machine for the full chip Global Critical Group Graph. It is further noted that the processes performed in Stages III and IV can be performed in parallel utilizing a plurality of leaf machines 16.

Stage III includes the step 27 of coloring/splitting non-critical polygons/features. More specifically, in each patch, a "Local Coloring Solver" is utilized to split the remaining non-critical polygons taking into consideration the results of the splitting of the critical polygons. After completion of Stage III, all polygons are split into two layers and/or patterns.

Finally, Stage IV includes the step 28 of stitching and performing OPC on the two (or more) layers generated by the decomposition process so as to ensure the combination and resulting image obtained by the double patterning process is correct. Further details of the foregoing stages are set forth below. It is noted that the OPC process is an optional step in the process.

Figure 3:
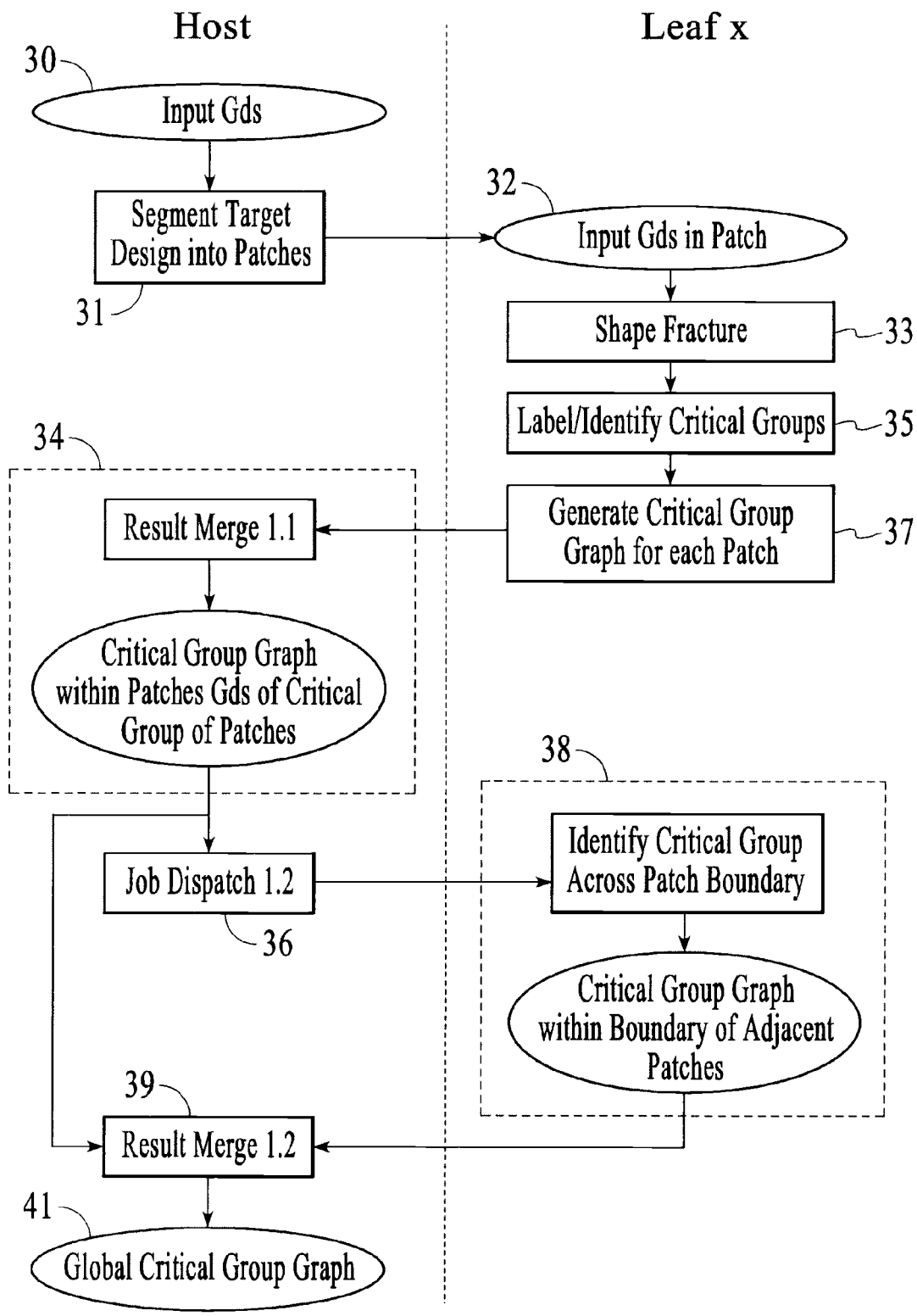
FIG. 3 is a flowchart illustrating an exemplary method for performing the process associated with Stage I of the present invention.

FIG. 3 is a flowchart illustrating an exemplary method for performing the process associated with Stage I. As shown in FIG. 3, there is a dashed vertical line which separates the processes performed by the host machine 14 (i.e., the processes to the left of the dashed line) and the processes performed by the leaf machines 16 (i.e., the processes to the right of the dashed line). It is noted that the division of processes between the host machine and leaf machine are not limited to those illustrated in FIG. 3. It is further noted that the processes performed in the leaf machines are executed independently so as to allow the processes to be performed in parallel with one another, thereby increasing the speed of execution of the overall process.

The process illustrated in FIG. 3 has substantially two rounds, which are referred to herein as the "inside patch round" and the "patch boundary merge round". In general, in the "inside patch round", the Critical Group Graph inside each patch is constructed. The Critical Group Graphs are then combined for each patch so as to obtain the Critical Group Graph for the full chip except for the links between the Critical Groups in different patches. Thereafter, in the "patch boundary merge" round, the links between the Critical Groups across patch boundaries are added. The results of the patch boundary merge round are then combined to obtain the full chip Global Critical Group Graph.

More specifically, during the "inside patch round" the host machine distributes the feature data of each patch 12 into one of the leaf machines 16, and then the leaf machines construct the "Critical Group Graph" for each individual patch 12. A "Critical Group Graph" is constructed for each patch 12 by performing the steps of: (a) "shape fracture" in which the polygons/features of the target design in the given patch 12 are broken or segmented into smaller rectangles and polygons; (b) "labeling/identifying critical groups", which entails detecting if any of the polygons of the given patch violate the Critical Relationship, and if so placing such polygons in the Critical Group and obtaining a default splitting/coloring arrangement for the features in the Critical Group; and (c) generating a Critical Group Graph by evaluating the correlation of different splitting configuration between nearby critical groups and then adding weighted edges to the Critical Group Graph. It is noted that during this round, the Critical Group Graph is constructed for polygons within the given patch. For example, as in FIG. 7, an edge or line is added between two Critical Groups if there are critical polygons which belong to those groups and which are linked by non-critical polygons. In the given disclosure, it is further noted that in the Critical Group Graph, the vertices identify Critical Groups, and the edges (or lines) represent the correlations between the Critical Groups. Further, the weights represent the importance of the given correlations. For example, at the patch boundary, the same polygon must be assigned the same color (layer) in different patches. Also, as previously noted, it is preferable to maintain the linked polygons in same color (i.e., layer).

The results associated with each Critical Group Graph of each patch are returned from the leaf machines to the host machine, and then as explained in detail further below, the host machine merges these results into the inside patch Critical Group Graphs to form the Global Critical Group Graph for the full-chip design.

FIG. 3 illustrates an exemplary process of the overall decomposition/coloring process associated with Stage I. Referring to FIG. 3, and as noted above, initially the host machine 14 receives the target pattern in a suitable data format (Step 30) and then segments the target data into patches (Step 31) and distributes the patches to the leaf machines (Step 32) so each of the leaf machines can perform the process of generating the Critical Group Graph for the given patch 12.

Figure 4A:
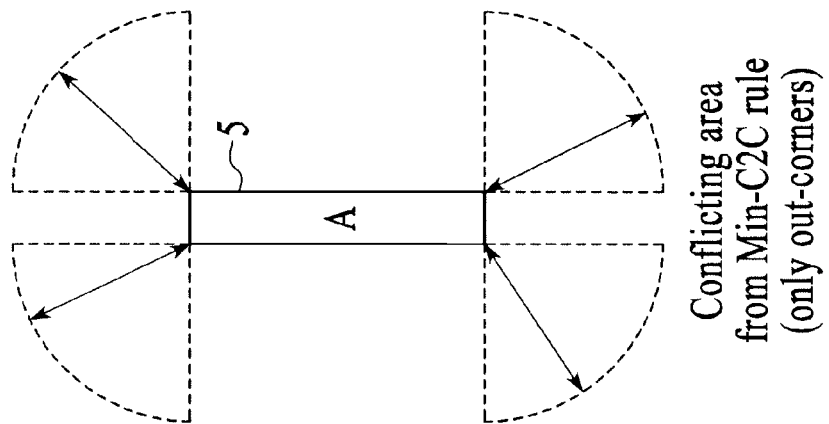
Referring to FIGS. 4a-4c and 5 illustrate application of exemplary minimum spacing requirements associated with a given feature.
Figure 4B:
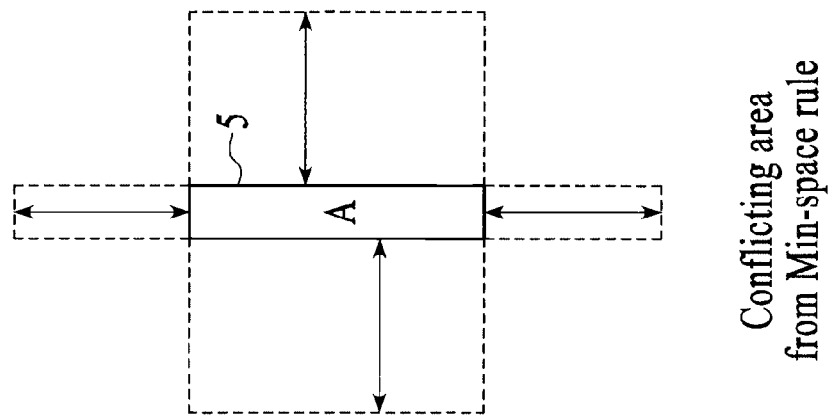
Figure 4C:
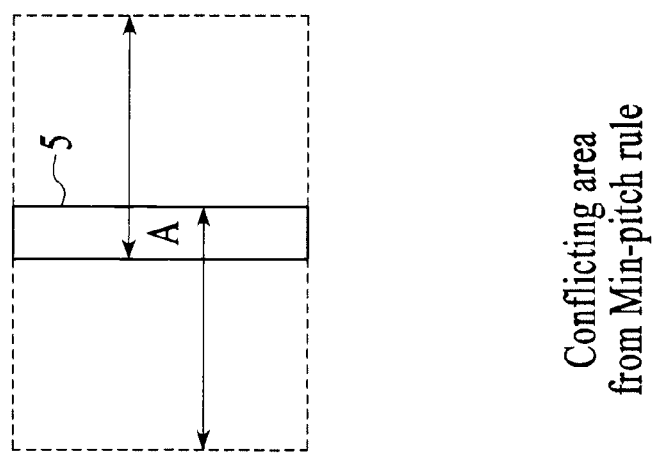

Once the target data associated with a given patch is input to the given leaf machine 16, the leaf machine 16 performs shape fracture process (Step 33). In the shape fracture process, polygons or features of the given patch are fractured/decomposed utilizing a set of predefined rules, which are a set of geometric limitations for a given layer based on, for example, but not limited to, the specified lithograph conditions to be utilized. For example, as shown in FIGS. 4(*a*)-4(*c*), the conflicting area of a given polygon can be identified by utilizing three rules which are: (a) a min-pitch rule (see, FIG. 4*a*), (*b*) a min-space rule (see, FIG. 4*b*) and (3) a min-C2C (corner-to-corner) rule (see, FIG. 4*c*). Referring to FIGS. 4*a*-4*c,* the foregoing rules operate to define an area around polygon 5, and if any other polygon is within this area, there is a violation of the Critical Relationship, which would require polygon 5 and the conflicting polygon (or a portion thereof) to be imaged in different masks. It is noted that different rules may also be utilized to determine conflicting areas of the polygons (i.e., polygons or portions thereof that violate the Critical Relationship rules defined for the given process).

Figure 5:
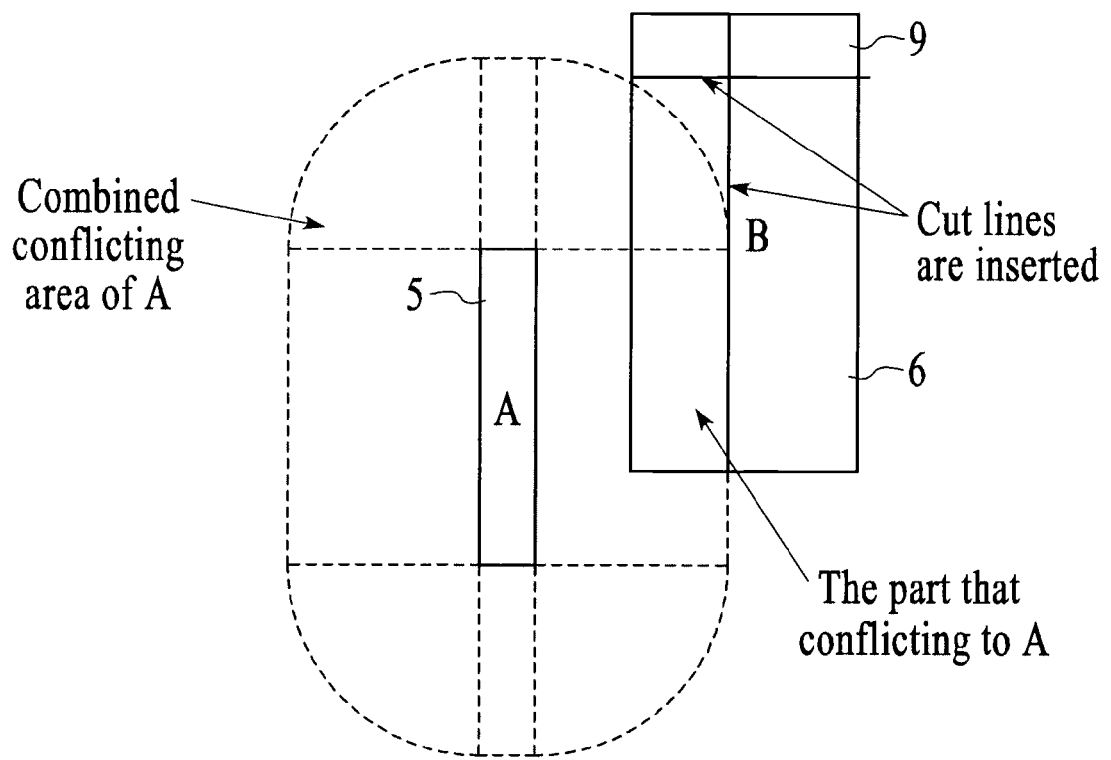

Referring to FIG. 5, as noted, the conflicting areas from three rules are combined so as to identify a whole conflicting area around the polygon 5. If another polygon conflicts (or enters) the area, this other polygon 6 is in conflict with polygon 5. In the example illustrated in FIG. 5, a second polygon 6 is within the conflict area associated with polygon 5. In such instances of conflict, the process proceeds to insert cut lines into the conflicting polygons 6 in order to isolate the parts of the polygon 6 causing the conflicting relationship. In other words, only the portion of the conflicting polygon is partitioned utilizing the cut lines. In the example shown in FIG. 5, a vertical and horizontal cut line 9 is inserted into polygon 6 so as to partition the left lower portion of polygon 6 which is in conflict with polygon 5. Further, if a polygon is fully conflicting to other polygon, it doesn't need to be fractured anymore. This process is performed for each conflicting polygon in each of the patches 12. It is noted that this process of partitioning conflicting polygons is performed automatically utilizing the target design data in conjunction with the pre-defined conflict area associated with each feature.

Referring again to FIG. 3, as noted, once the polygons of a given patch 12 have been fractured, the next step in the process is to identify and label the critical groups for each patch (Step 35). As such, this step is performed for each set of fractured polygons associated with a given patch 12. More specifically, the polygons which are in conflict with other polygons in a given patch are named/identified as the Critical Polygons. Each such Critical Polygon is defined as a vertex in the graph, and the weighted conflicting edges are added to the graph so as to define the conflicting relationship. The weight is determined by the conflicting types between the two polygons. If two critical polygons are linked to each other, a linking edge with weight equal to zero is added into the graph. It is noted that in the given embodiment, the lower the weight, the higher the priority.

The types of conflicts defined for the given embodiment are identified in FIG. 4. The conflicts are minimum-pitch, minimum-space and minimum-C2C conflicts. In the given embodiment, a weight of "1" is assigned to polygons violating the min-pitch requirement; a weight of "2" is assigned for violations of the min-space requirement; and a weight of "3" is assigned for polygons violating the minimum C2C requirement. This is done because it is typically easier to solve the minimum C2C requirement, than either the minimum space requirement or the minimum pitch, utilizing DFM if it is not possible to split the polygons and therefore a change to the original design is required. It is noted that the weight is utilized for the Critical Group Labeling step.

Each connected component or critical polygon of the conflicting/linking graph forms a Critical Group for the given patch. For each Critical Group, a Min-Span-Tree is constructed. With regard to the differences between the Critical Group Graph and the Min-Span-Tree, it is first noted that the Critical Group Graph is more generic than the Min-Span-Tree. More specifically, the definition of the graph is a set of Vertices (Nodes) and a set of Edges(Lines) between the vertices. A tree is a specific graph where there is no loop in the graph. In other words, in a tree, there is at most one path from one vertex to any other vertex. All vertices in the original Critical Group Graph are in the Min-Span-Tree, and the edges in the Min-Span-Tree be must in the original Critical Group Graph (i.e., if there is a path between two vertices in the original graph, there must be a path between them in the span-tree). It is further noted that the Min-Span-Tree of the Critical Group Graph is one with the minimal total edge weights among all possible span-trees of the original graph.

Once the Min-Span-Tree is generated, the tree is colored by two colors using the following algorithm/process: choose one vertex as the root and color it with one layer (i.e., a first color); visit all vertices by breadth-first or depth-first search; if the edges between the vertex and its parent vertex is a conflicting edge, then the vertex is assigned with the opposite color of its parent color; otherwise, the vertex is assigned the same color as its parent vertex. In the given embodiment, the color of each vertex is the default color of the corresponding polygon inside the critical group.

All the edges of the conflicting/linking graph are checked with the colored vertices. In the following two cases: 1) the edge is a conflicting edge but the two vertices have same color, or 2) the edge is a linking edge but the two vertices have different color, there is a native conflict between these vertices in this critical group. Such native conflicts are reported to the operator so that the operator can resolve such native conflicts, for example, by modifying the target pattern.

The weights in the conflicting/linking graph have the potential to facilitate or enhance the design for manufacture DFM (design for manufacturer) characteristics of the resulting patterns. For example, the weight of the conflicting edge can be designed to represent how readily the conflict can be avoided by DFM. As noted above, the Min-Span-Tree maintains the edges with smaller weights. Therefore, the edges for the reported native conflicts have larger weights and are easier to correct utilizing DFM.

Figure 6:
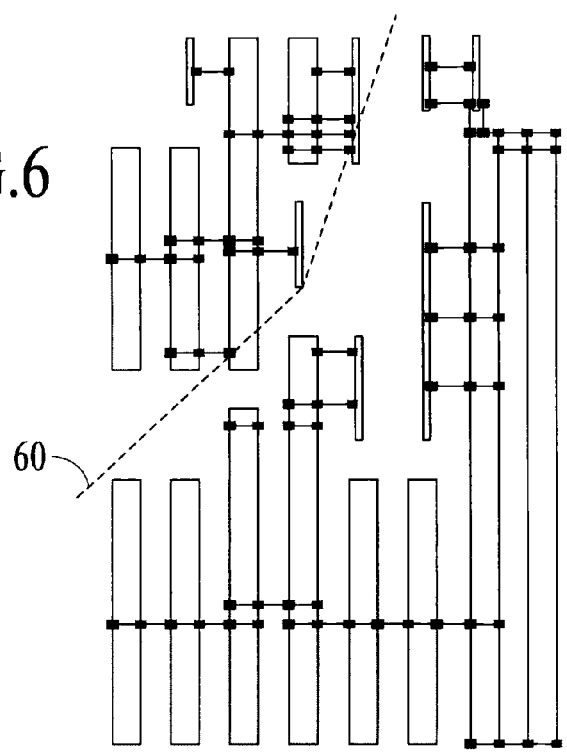
FIG. 6 illustrates an exemplary Critical Group associated with a given patch.

An illustration of example critical groups is shown in FIG. 6. Referring to FIG. 6, based on the conflicting relationships between critical polygons, 62 polygons are grouped into 2 critical groups and some non-critical polygons. The first critical group, referred to as C1, is located above and to the left of the dashed line 60, which the second critical group, which is referred to as C2, is located to the right and below dashed line 60. As noted above, the edges between the polygons represent the Critical Relationships. All critical polygons which have edges between them are grouped into one Critical Group. In the example shown in FIG. 6, the critical polygons form only two groups C1 and C2.

As noted above, once the critical groups of the given patch are defined, the critical group graph is generated for the given patch (Step 37). Each critical group becomes a vertex in the graph. The vertex has two possible coloring statuses, which are maintaining its default coloring configuration (KEEP) or flipping it (i.e., changing to the other color) (FLIP). The edges between vertices denote the correlation between the default color configurations of the critical groups. The edges have two types: positive and negative. Each edge has a weight to denote the strength of the correlation, a smaller weight means a stronger correlation.

Figure 7:
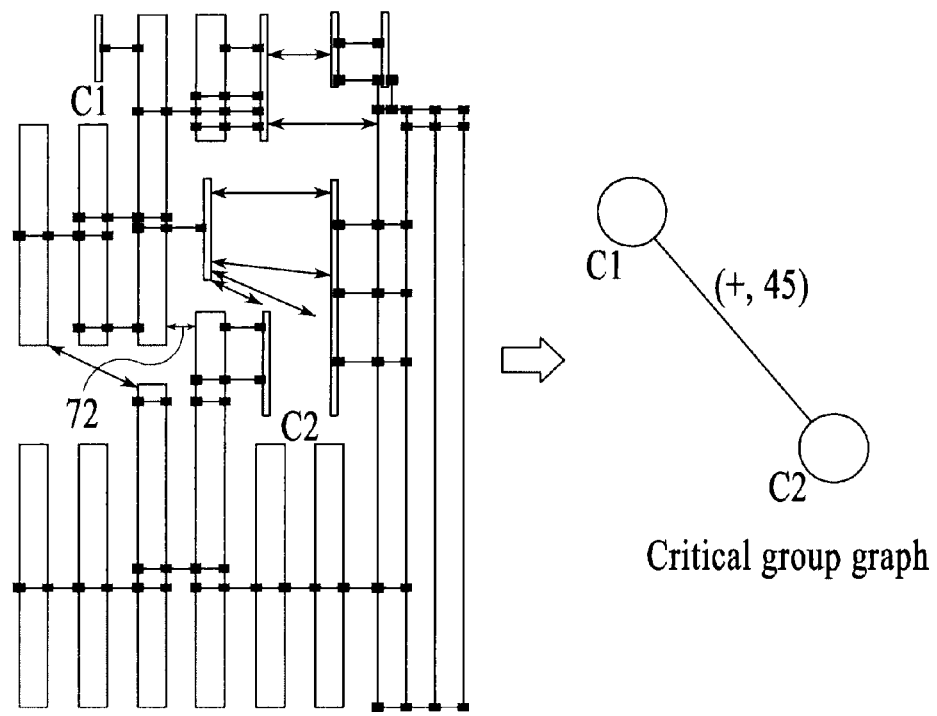
FIG. 7 illustrates an exemplary Critical Group Graph associated with the Critical Group illustrated in FIG. 6.

FIG. 7 illustrates an exemplary critical group graph for the exemplary patch illustrated in FIG. 6. In the given embodiment, a rule-based method is utilized to evaluate the weight between critical groups. As shown in FIG. 7, for each pair of the polygons which belong to different critical groups and linked by non-critical polygons, the distance between the polygons is calculated as the correlation weight between the two polygons. These polygons are connected utilizing arrows as shown in FIG. 7. The length of each arrow designates the distance between the features forming the given pair of the features. Among these distances, the smallest one, which is illustrated as arrow 72, is chosen as the correlation weight between these two critical groups C1 and C2, as it represents the shortest distance. Also, it is further noted that the correlation is positive when the two polygons have the same default color. Otherwise, the correlation is negative. In this example, the correlation between the two features coupled by arrow 72 The critical group graph inside each patch 12 is constructed in this manner.

As noted above, in the Critical Group Graph, the vertices are Critical Groups, and the edges (lines) represent the relationship (constraints) between the coloring of the Critical Groups. The objective is to assign two colors to each vertex and try to satisfy the important relationship (constraints) between the vertices. The min-span-tree is generated from the Critical Group Graph so as to maintain the more important edges, which have lower weights. Then, all vertices are colored based on the Min-Span-Tree while relationship (constraints) which are represented by the edges in the Min-Span-Tree are satisfied in this procedure.

Next, the critical group graphs of each of the patches is returned to the host machine to begin the process of merging the critical group graphs of each patch (Step 34). In Step 34, the results from the leaf machines are sent back to host, and the host machine combines the results together. There are essential two operations performed during Step 34. The first is the Critical Group Graph within patches is combined with the result of "Boundary Merge round" to obtain the Critical Group Graph for full chips. The second is the Gds of Critical Graph Groups for patches are utilized as the input for the "Boundary Merge round" performed in Step 38.

After performing Step 34, the gds and the Critical Group labels within the boundaries of adjacent patches 12 are dispatched to the leaf machines 16 (Step 36). Then, the patch boundary merge process (Step 38) is performed. In this step, the correlation between the Critical Groups in different patch is added into the Critical Group Graph. More specifically, it is noted that in the overlapped area of patch boundaries, the same polygon/feature may belong to different Critical Groups of different patches. Such polygons must have the same layer assignment in the final split result. In order to achieve this objective, an edge with the smallest weight is added between the Critical Groups across the patch boundary. If the same polygon has the same layer assignment in two Critical Groups of different patches, the correlation is positive. Otherwise, the correlation is negative.

Figure 8:
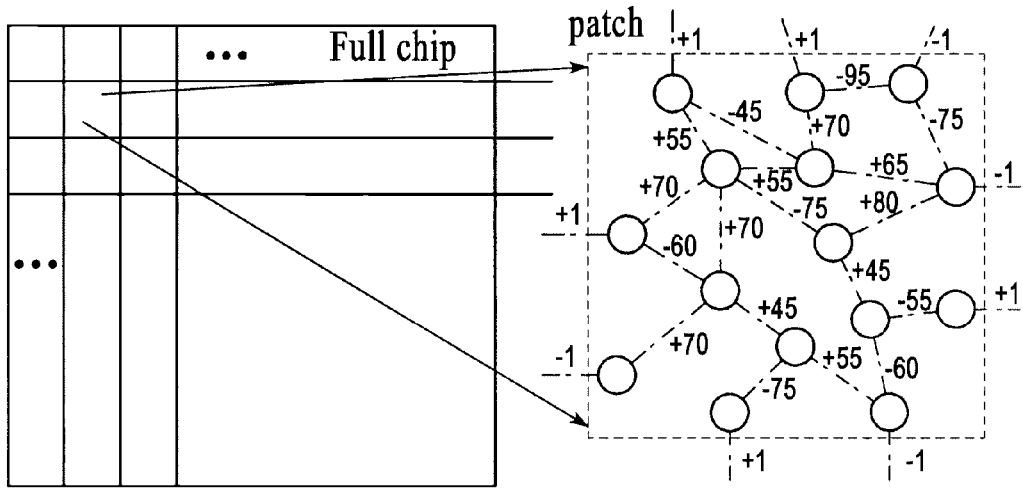
FIGS. 8a and 8b illustrate an exemplary Global Critical Group Graph.

Next, the data resulting from the patch boundary merge process is returned to the host machine 14 (Step 39) and the Global Critical Group Graph of the full-chip is generated by combining the edges inside the patches from the "Inside-Patch Round" and the edges across the patch boundaries from the "Patch Boundary Merge Round". FIGS. 8a and 8b illustrate an example of a Critical Group Graph for the full chip. FIG. 8a is an exemplary global view of the full chip, while FIG. 8b provides an exemplary detailed view for one given patch. It is noted that the edges across the patch boundary in the FIG. 8b are linked to the Critical Groups in the adjacent patches.

Figure 9:
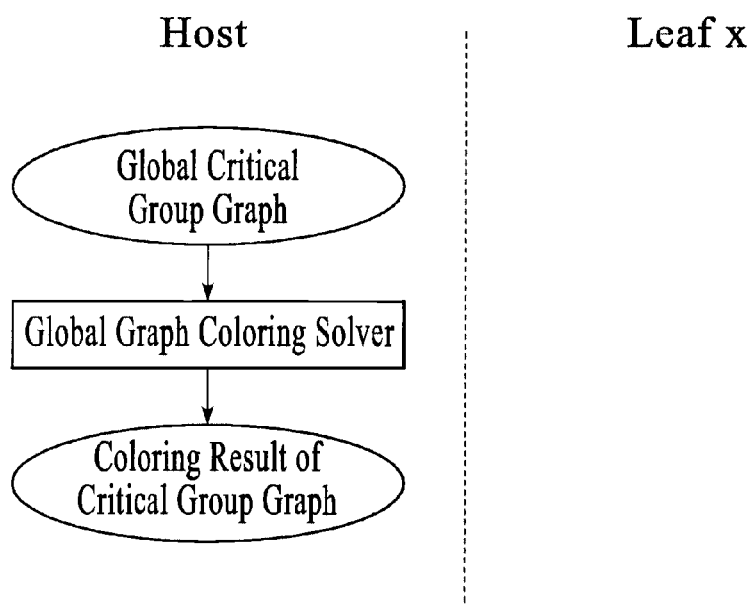
FIG. 9 is a flowchart illustrating an exemplary method for performing the process associated with Stage II of the present invention.

Once the Global Critical Group Graph is generated, the process proceeds to Stage II of the overall process, which is illustrated in FIG. 9. In Stage II, the Global Graph Coloring Solver process is executed in the host machine 14. More specifically, a hierarchical coloring algorithm is employed to solve the Global Critical Group Graph of the full-chip, which typically has large number of vertices and edges.

Figure 10:
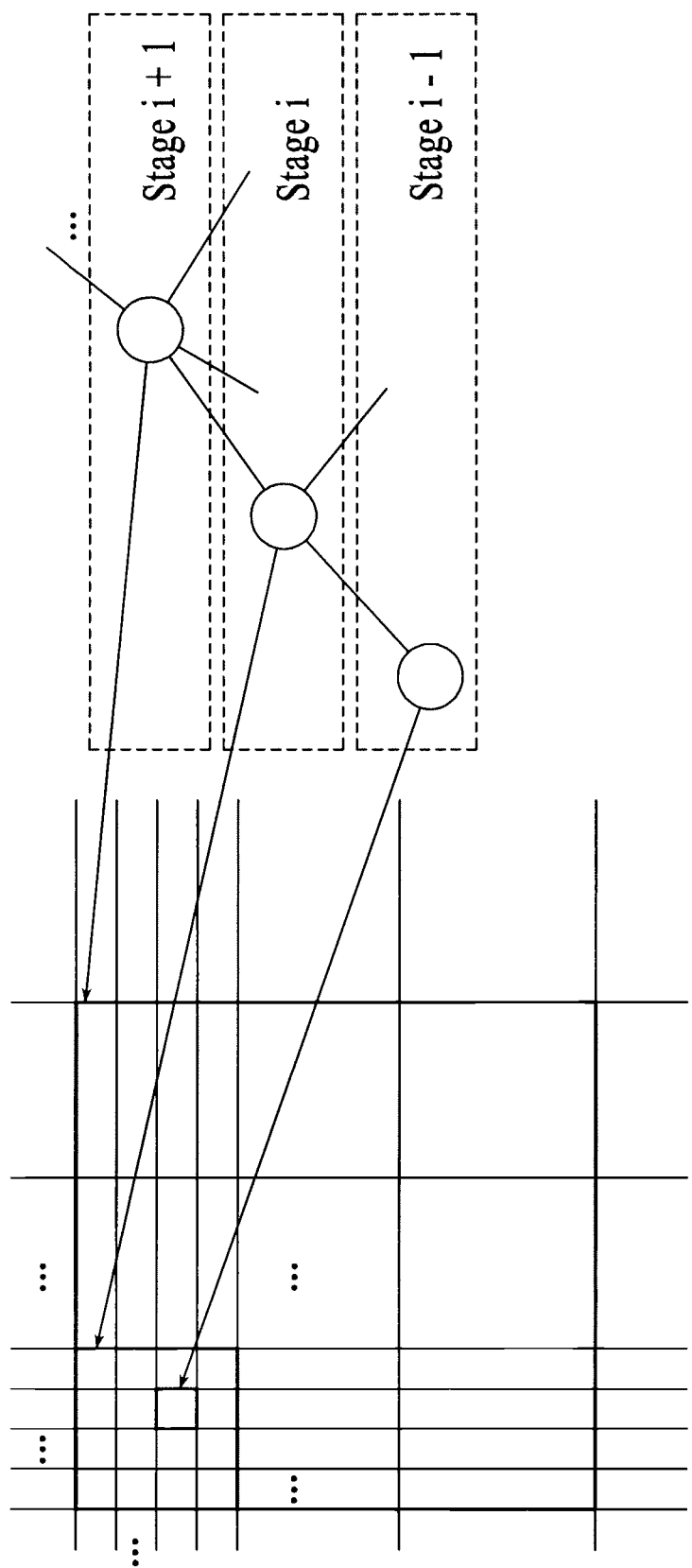
FIG. 10 is an exemplary illustration of the hierarchical structure associated with the Global Graph Coloring Solver.

Referring to FIG. 10, during execution of the Global Graph Coloring Solver, at each stage, the patches of the full-chip are organized into several groups. The groups in lower stages are further combined in a higher stage. Finally, all the patches of full chip are combined into one group in the top stage. The hierarchical stages can be constructed statically or dynamically according to the resource limitation of system and the resource requirement of the algorithm to process the groups in each stage.

Based on the hierarchical structure, the algorithm operates to color the whole graph first by a "Bottom-Up" step, which is executed from the bottom stage to the top stage, and then by a "Top-Down" step, which is executed from top stage to bottom stage. Each critical group, which is a vertex in the graph, is assigned by two possible statuses (colors): KEEP or FLIP.

Figure 11:
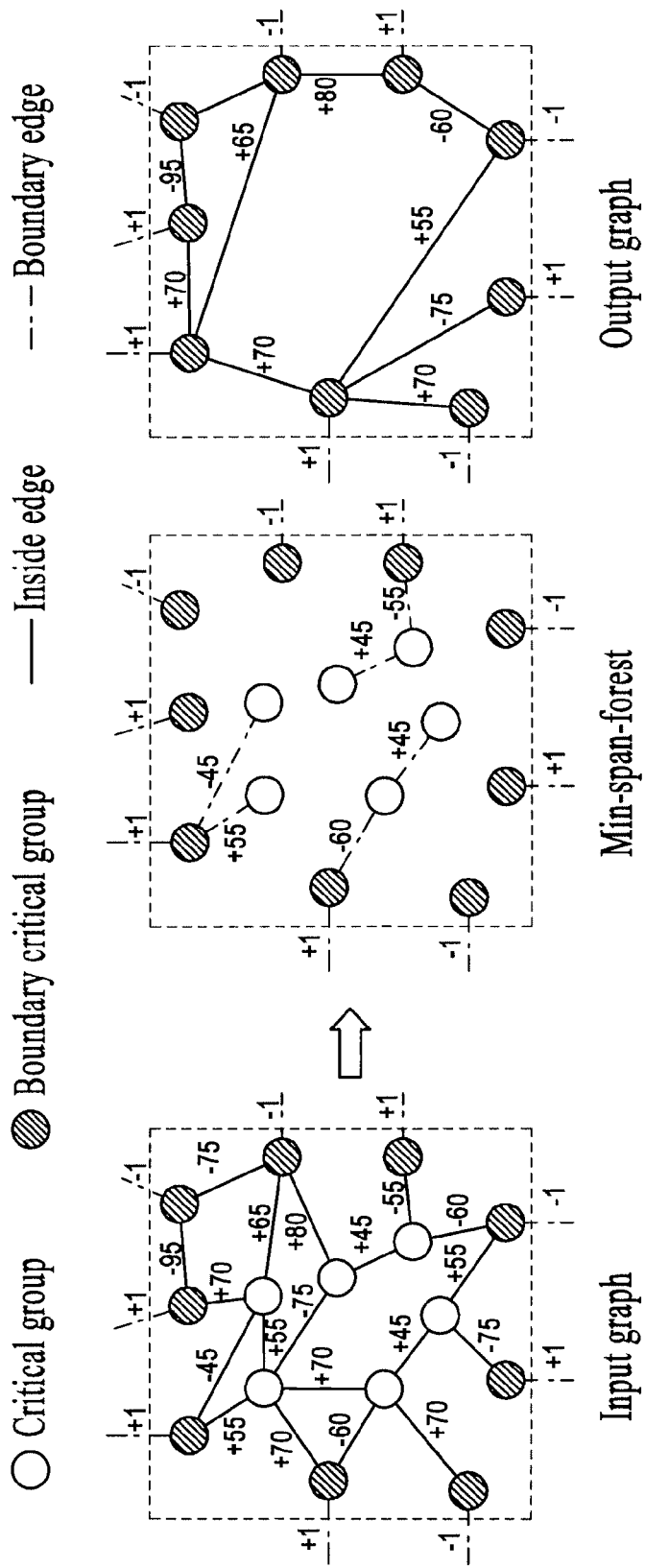
FIGS. 11(a)-11(c) illustrate an example application of the "Bottom-Up" step algorithm of the present invention.

In the Bottom-Up step, the following algorithm is executed for each group in this stage as shown in FIGS. 11(a)-11(c). First, combine the output graph of its children groups in lower stage to generate the input graph (see, FIG. 11(a)). Label all boundary vertices in the graph which have edges linked to the nodes outside this group. A Min-Span-Forest (see, FIG. 11(b)) is then constructed inside the graph. The Min-Span-Forest is substantially similar to the Min-Span-Tree, but the boundary vertices must be in different trees and the boundary vertices must be the roots of the trees. Then, for each tree in the Min-Span-Forest, from its root vertex, the correlation of each node related to the root node is calculated by breadth-first or depth-first search. If the current vertex is linked to the parent vertex by a positive edge, it has the same correlation to the root vertex as the parent vertex. Otherwise, the vertex has the opposite correlation to its root vertex compared to its parent vertex. All the boundary vertices are used to construct the output graph of this group. The edges with minimal weights between trees are selected as the edges between the boundary vertices.

Figure 12:
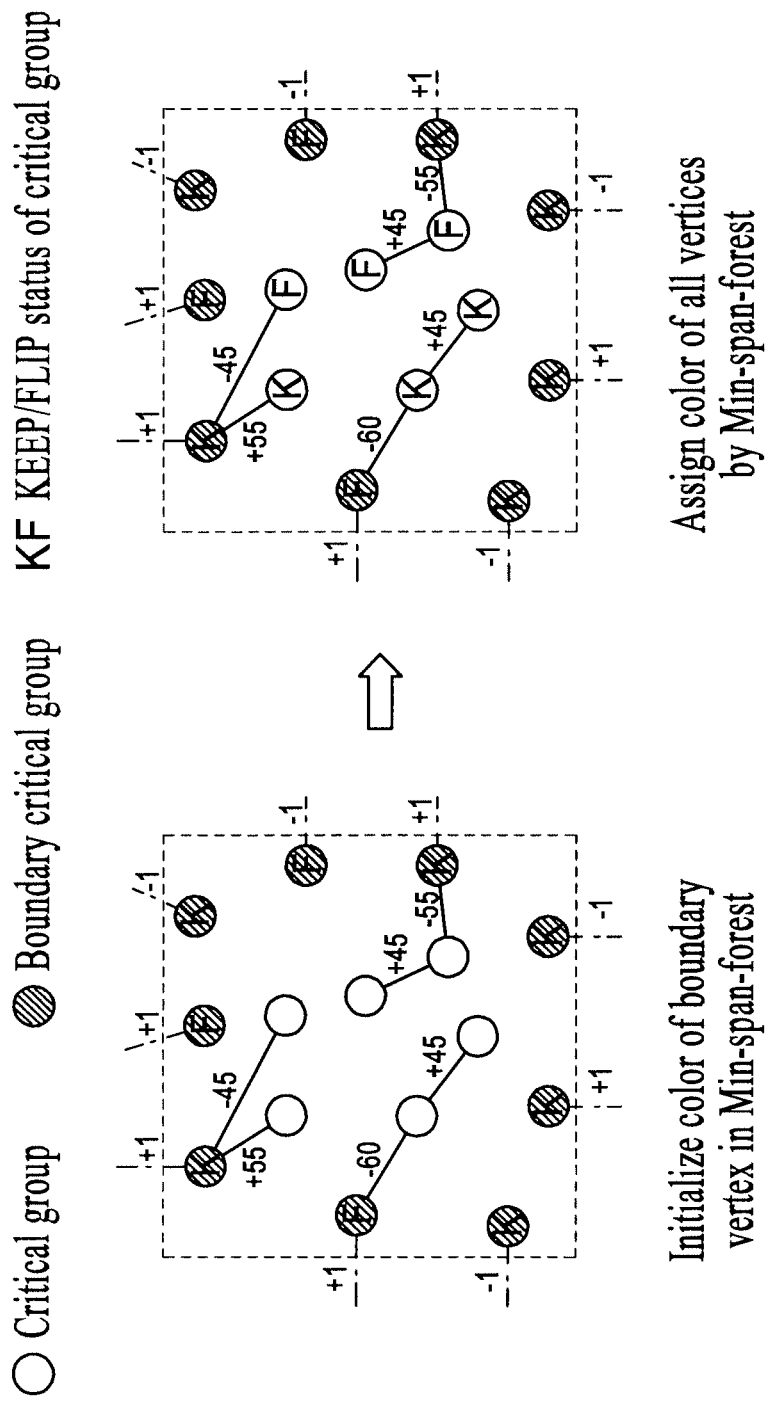
FIGS. 12(a) and 12(b) illustrate an example application of the "Top-Down" step algorithm of the present invention.

In the Top-Down step, the following algorithm is executed for each group in this stage as shown in FIGS. 12(a) and 12(b). First, initialize the status (color) of the roots in the Min-Span-Forest (see, FIG. 12(a)). If the root of the tree is a boundary vertex, obtain the status (color) of the critical group from the coloring result of the higher stage. Otherwise, randomly initialize the status (color) of the critical group by KEEP or FLIP. Assign the status (color) of all vertices in the Min-Span-Forest by breath-first or depth-first search (see, FIG. 12(b)). If the current vertex has a positive correlation to the root vertex, assign the same status (color) as the root vertex. Otherwise, assign the opposite status (color) of the status (color) of the root vertex.

In the top stage, there is no boundary vertex in the graph, all roots of the Min-Span-Forest have been initialized by status KEEP or FLIP. In the bottom stage, all critical groups of the full chip have been colored by the status KEEP or FLIP. If one critical group has been assigned to KEEP, each critical polygon which belongs to this critical group will be colored by its default color in the critical group. Otherwise, the critical group has been assigned the status FLIP, each critical polygon which belongs to this critical group will be assigned by the opposite of its default color.

As detailed above, the process of the present invention provides numerous advantages over the known decomposition processes. Most importantly, the process provides for a fast and efficient method of decomposing a full-chip pattern or design. In particular, the process of the present invention allows processing (i.e., decomposition) of patches of the design to be executed in parallel thereby reducing the time required for completion of the decomposition process. The process also provides, through the use of the "Critical Group Graph", a flexible framework which allows for easy incorporation of previous patch level decompositions or coloring. Further, the process also provides for, through the use of "Critical Groups", a reduction in the amount of data that is required to be processed at the full-chip level, thereby significantly reducing the data processing capability requirements and the time required to complete the decomposition process. Finally, the hierarchical structure of the "Global Graph Coloring Solver" of the present invention provides good scalability for handling large full-chip designs.

Figure 13:
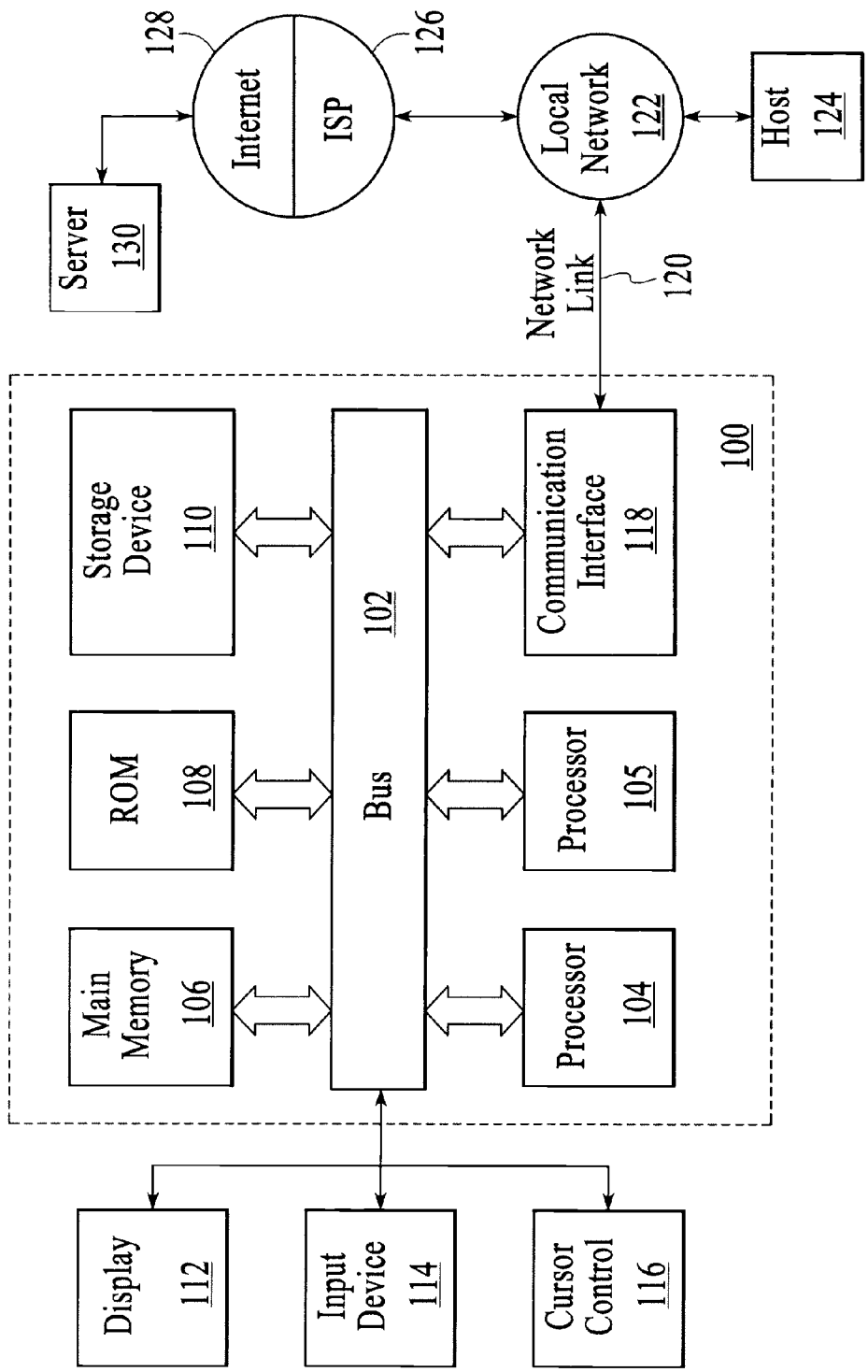
FIG. 13 is a block diagram that illustrates a computer system which can implement illumination optimization according to an embodiment of the present invention.

FIG. 13 is a block diagram that illustrates a computer system 100 which can implement the pattern decomposition process detailed above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the coloring process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 14:
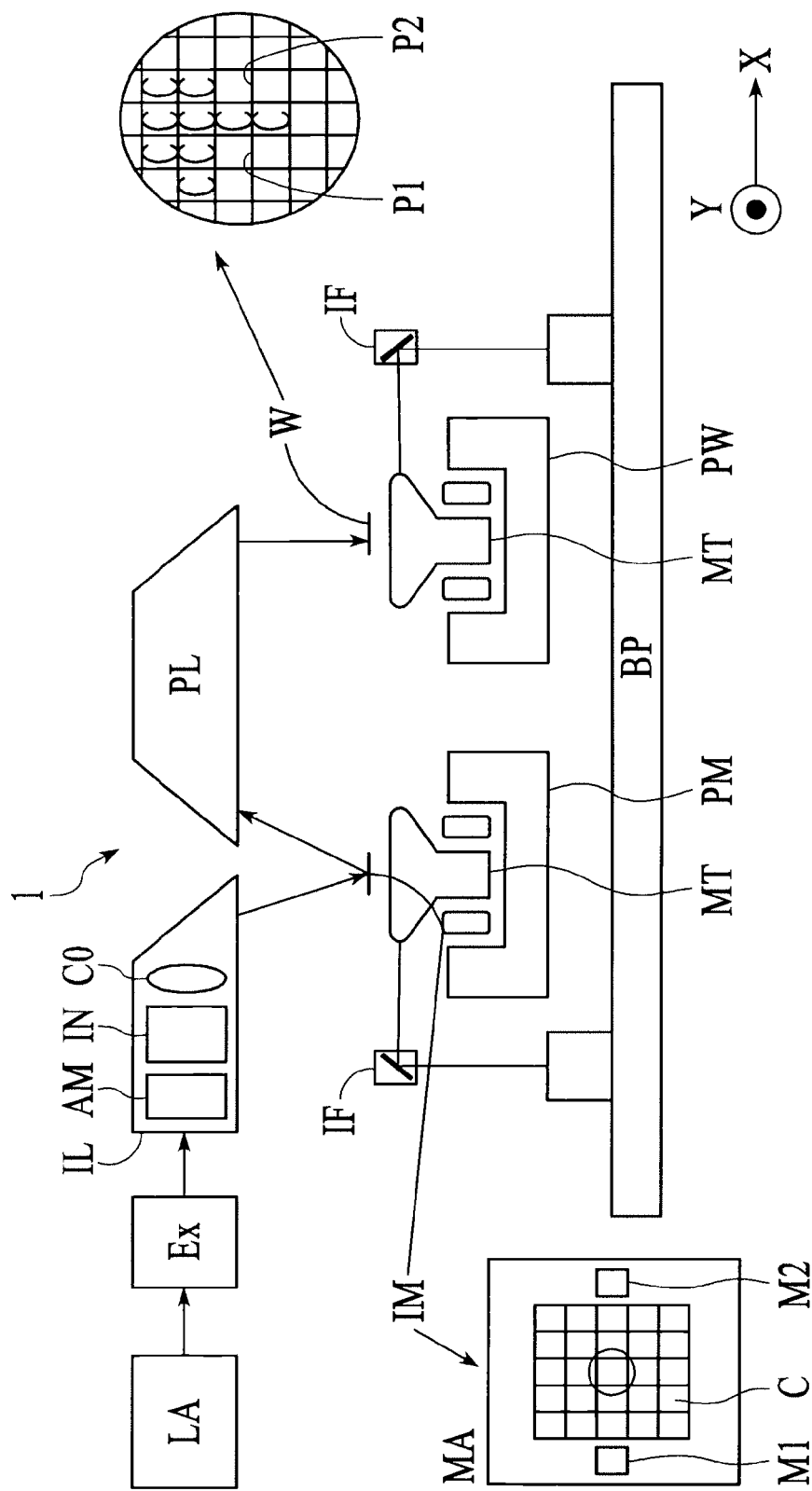
FIG. 14 schematically depicts an exemplary lithographic projection apparatus suitable for use with a mask designed with the aid of the disclosed concepts.

FIG. 14 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 14 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 14. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method for decomposing a target pattern containing features to be printed on a wafer, into multiple patterns, comprising the steps of:
   segmenting said target pattern into a plurality of patches;
   for each of said plurality of patches, identifying critical features within each patch which violate minimum spacing requirements;
   identifying one or more critical groups in each patch having identified critical features, wherein said critical groups respectively comprise a plurality of features including one or more of said identified critical features;
   generating a critical group graph for each of said plurality of patches having critical features, said critical group graph of a given patch linking together the critical groups and thereby defining a coloring scheme for said critical groups in said given patch, wherein said respective plurality of features within a single critical group share the same color;
   identifying critical groups in said plurality of patches that have features extending into adjacent patches;
   generating a global critical group graph for said target pattern, including stitching together said critical group graphs of each of said plurality of patches, and inserting graph edges between said critical groups that have said features extending into adjacent patches; and
   coloring said features in said target pattern in accordance with said global critical group graph by assigning a color to each of said critical groups,
   wherein one or more of the steps of segmenting, identifying, generating a critical group graph, generating a global critical group graph and coloring are implemented using a computer.

2. A method for decomposing a target pattern according to claim 1, wherein each of said plurality of patches have the same size.

3. A method for decomposing a target pattern according to claim 1, wherein said critical features are any features which fail at least one of a minimum pitch rule, a minimum space rule and a minimum corner to corner rule.

4. A method for decomposing a target pattern according to claim 1, wherein said critical group graph defines one or more critical groups for each of said plurality of patches, each of said critical groups comprising at least one critical feature.

5. A method for decomposing a target pattern according to claim 1, wherein said critical group graph identifies weights assigned to conflicting critical groups, said weights defining a priority associated with the given conflict between said critical groups.

6. A method for decomposing a target pattern according to claim 1, wherein the plurality of patches comprise contiguous, non-overlapping sections of the target pattern.

7. A method for decomposing a target pattern according to claim 1, further comprising, before generating said critical group graphs, assigning each of said plurality of patches to a respective computer processor, wherein each said respective computer processor simultaneously generates said critical group graph for said respective patch in parallel.

8. A non-transitory computer readable storage medium having stored thereon a computer program for decomposing a target pattern containing features to be printed on a wafer, into multiple patterns, when executed, causing a computer to perform the steps of:
   segmenting said target pattern into a plurality of patches;
   for each of said plurality of patches, identifying critical features within each patch which violate minimum spacing requirements;
   identifying one or more critical groups in each patch having identified critical features, wherein said critical groups respectively comprise a plurality of features including one or more of said identified critical features;
   generating a critical group graph for each of said plurality of patches having critical features, said critical group graph of a given patch linking together the critical groups and thereby defining a coloring scheme for said critical groups in said given patch, wherein said respective plurality of features within a single critical group share the same color;
   identifying critical groups in said plurality of patches that have features extending into adjacent patches;
   generating a global critical group graph for said target pattern, including stitching together said critical group graphs of each of said plurality of patches, and inserting graph edges between said critical groups that have said features extending into adjacent patches; and
   coloring said features in said target pattern in accordance with said global critical group graph by assigning a color to each of said critical groups.

9. A non-transitory computer readable storage medium according to claim 8, wherein each of said plurality of patches have the same size.

10. A non-transitory computer readable storage medium according to claim 8, wherein said critical features are any features which fail at least one of a minimum pitch rule, a minimum space rule and a minimum corner to corner rule.

11. A non-transitory computer readable storage medium according to claim 8, wherein said critical group graph defines one or more critical groups for each of said plurality of patches, each of said critical groups comprising at least one critical feature.

12. A non-transitory computer readable storage medium according to claim 8, wherein said critical group graph identifies weights assigned to conflicting critical groups, said weights defining a priority associated with the given conflict between said critical groups.

13. A non-transitory computer readable storage medium according to claim 8, wherein the plurality of patches comprise contiguous, non-overlapping sections of the target pattern.

14. A device manufacturing method comprising the steps of:
   (a) providing a substrate that is at least partially covered by a layer of radiation-sensitive material;

(b) providing a projection beam of radiation using an imaging system;
(c) using patterns on masks to endow the projection beam with patterns in its cross-section;
(d) projecting the patterned beam of radiation onto a target portion of the layer of radiation-sensitive material,
wherein in step (c), providing a pattern on a mask includes the steps of:
segmenting a target pattern into a plurality of patches;
for each of said plurality of patches, identifying critical features within each patch which violate minimum spacing requirements;
identifying one or more critical groups in each patch having identified critical features, wherein said critical groups respectively comprise a plurality of features including one or more of said identified critical features;
generating a critical group graph for each of said plurality of patches having critical features, said critical group graph of a given patch linking together the critical groups and thereby defining a coloring scheme for said critical groups in said given patch, wherein said respective plurality of features within a single critical group share the same color;
identifying critical groups in said plurality of patches that have features extending into adjacent patches;
generating a global critical group graph for said target pattern, including stitching together said critical group graphs of each of said plurality of patches, and inserting graph edges between said critical groups that have said features extending into adjacent patches; and
coloring said features in said target pattern in accordance with said global critical group graph by assigning a color to each of said critical groups.

15. A computer-implemented method for forming masks for use in a photolithography process for imaging a target pattern containing features to be printed on a wafer, comprising the steps of:
segmenting said target pattern into a plurality of patches;
for each of said plurality of patches, identifying critical features within each patch which violate minimum spacing requirements;
identifying one or more critical groups in each patch having identified critical features, wherein said critical groups respectively comprise a plurality of features including one or more of said identified critical features;
generating a critical group graph for each of said plurality of patches having critical features, said critical group graph of a given patch linking together the critical groups and thereby defining a coloring scheme for said critical groups in said given patch, wherein said respective plurality of features within a single critical group share the same color;
identifying critical groups in said plurality of patches that have features extending into adjacent patches;
generating a global critical group graph for said target pattern, including stitching together said critical group graphs of each of said plurality of patches, and inserting graph edges between said critical groups that have said features extending into adjacent patches; and
coloring said features in said target pattern in accordance with said global critical group graph by assigning a color to each of said critical groups,
wherein one or more of the steps of segmenting, identifying, generating a critical group graph, generating a global critical group graph and coloring are implemented using a computer.

16. A method for forming masks according to claim 15, wherein each of said plurality of patches have the same size.

17. A method for forming masks according to claim 15, wherein said critical features are any features which fail at least one of a minimum pitch rule, a minimum space rule and a minimum corner to corner rule.

18. A method for forming masks according to claim 15, wherein said critical group graph defines one or more critical groups for each of said plurality of patches, each of said critical groups comprising at least one critical feature.

19. A method for forming masks according to claim 15, wherein said critical group graph identifies weights assigned to conflicting critical groups, said weights defining a priority associated with the given conflict between said critical groups.

20. A method for forming masks according to claim 15, wherein the plurality of patches comprise contiguous, non-overlapping sections of the target pattern.

* * * * *

UNITED STATES PATENT AND TRADEMARK OFFICE
CERTIFICATE OF CORRECTION

| | | |
|---|---|---|
| PATENT NO. | : 8,572,521 B2 | Page 1 of 1 |
| APPLICATION NO. | : 12/270498 | |
| DATED | : October 29, 2013 | |
| INVENTOR(S) | : Luoqi Chen et al. | |

It is certified that error appears in the above-identified patent and that said Letters Patent is hereby corrected as shown below:

On Title Page, Item (75) Inventors, Line 1
   replace "Luoqui Chen"
   with --Luoqi Chen--.

Signed and Sealed this
Ninth Day of September, 2014

Michelle K. Lee
*Deputy Director of the United States Patent and Trademark Office*